(12) United States Patent
Chae et al.

(10) Patent No.: US 7,693,200 B2
(45) Date of Patent: Apr. 6, 2010

(54) SEMICONDUCTOR LASER DIODE HAVING RIDGE

(75) Inventors: Jung-hye Chae, Seoul (KR); Jong-in Shim, Seoul (KR); Kyoung-ho Ha, Seoul (KR); Kyu-sang Kim, Seoul (KR); Han-youl Ryu, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 97 days.

(21) Appl. No.: 11/657,672

(22) Filed: Jan. 25, 2007

(65) Prior Publication Data

US 2007/0195851 A1 Aug. 23, 2007

(30) Foreign Application Priority Data

Feb. 21, 2006 (KR) .................. 10-2006-0016865

(51) Int. Cl.
*H01S 5/00* (2006.01)

(52) U.S. Cl. .................................. 372/46.01

(58) Field of Classification Search ............... 372/46.01
See application file for complete search history.

(56) References Cited

U.S. PATENT DOCUMENTS

| 5,218,614 | A  | * | 6/1993 | Mihashi ............. 372/46.01 |
| 5,732,101 | A  | * | 3/1998 | Shin .................... 372/92 |
| 6,377,597 | B1 | * | 4/2002 | Okumura .......... 372/45.01 |
| 2002/0114368 | A1 | * | 8/2002 | Cho et al. ................ 372/46 |

* cited by examiner

*Primary Examiner*—Minsun Harvey
*Assistant Examiner*—Patrick Stafford
(74) *Attorney, Agent, or Firm*—Cantor Colburn LLP (57) ABSTRACT

A semiconductor laser diode including a substrate, and a first semiconductor layer, an active layer, a second semiconductor layer and an electrode sequentially formed on the substrate is provided. In the semiconductor laser diode, the second semiconductor layer has a ridge and the electrode is formed on the ridge of the second semiconductor layer at a width which is less than the width of the ridge.

12 Claims, 11 Drawing Sheets

SEMICONDUCTOR LASER DIODE HAVING RIDGE

CROSS-REFERENCE TO RELATED PATENT APPLICATION

This application claims the benefit of Korean Patent Application No. 10-2006-0016865, filed on Feb. 21, 2006, in the Korean Intellectual Property Office, the disclosure of which is incorporated herein in its entirety by reference.

BACKGROUND OF THE DISCLOSURE

1. Field of the Disclosure

The present disclosure relates to a semiconductor laser diode, and more particularly, to a semiconductor laser diode having a ridge-shaped layer on an active layer.

2. Description of the Related Art

As semiconductor laser diodes require high optical extraction efficiency against applied power, research is being conducted to optimize their structure.

A typical semiconductor laser diode having a p-type electrode contacting the entire surface of a p-type cladding layer has difficulty in operating in a single transverse mode using laser light generated in an active layer. Thus, a ridge-shaped cladding layer is formed on the active layer in order to achieve single transverse mode operation.

Figure 1:
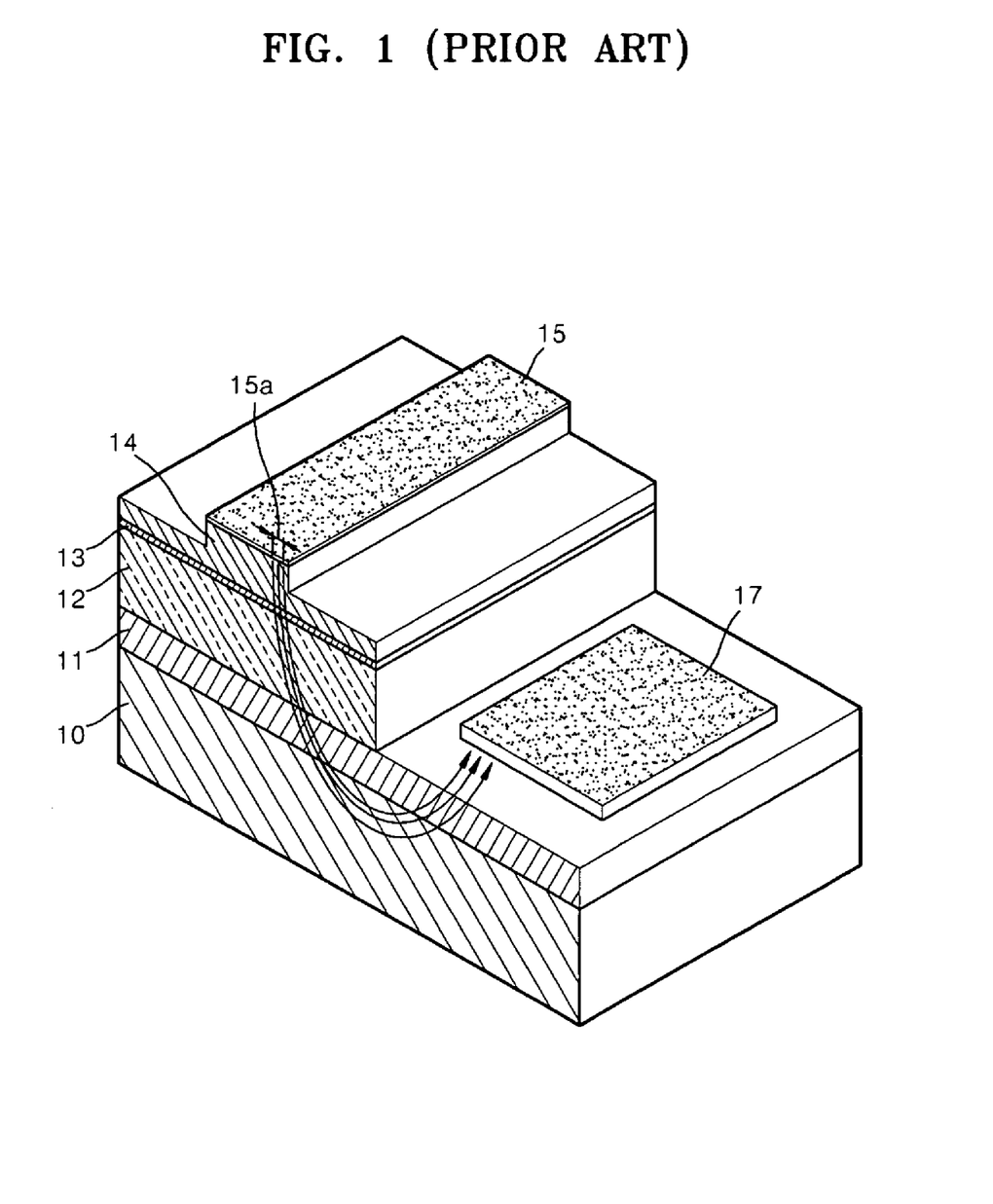
FIG. 1 illustrates a path along which carriers flow from a p-type electrode to an n-type electrode in a conventional semiconductor laser diode having a ridge.

FIG. 1 illustrates a path which carriers flow from a p-type electrode 15 to an n-type electrode 17 in a conventional semiconductor laser diode having a ridge. Referring to FIG. 1, the conventional semiconductor laser diode includes a substrate 10, an n-semiconductor layer 11, an n-cladding layer 12, an active layer 13 having a multi-quantum well (MQW) structure, a ridge-shaped p-cladding layer 14, and the p-type electrode 15 formed sequentially on the substrate 10. The conventional semiconductor laser diode further includes the n-type electrode 17 formed on a portion of the n-semiconductor layer 11 where the n-cladding layer 12 is absent. As illustrated in FIG. 1, the conventional semiconductor laser diode with the ridge-shaped p-cladding layer 14 and the p-type electrode 15, formed on the active layer 13 restricts the path along which current is injected into the active layer 13.

By increasing a ridge width in a semiconductor laser diode having a ridge, optical output power may be improved.

However, in the conventional ridged semiconductor laser diode in which the dimension of the p-type electrode 15 is equal to that of the ridge, a maximum output power can be increased by a limited degree and a saturated voltage drop occurs even when the ridge width is increased. This results from current crowding.

Figure 2:
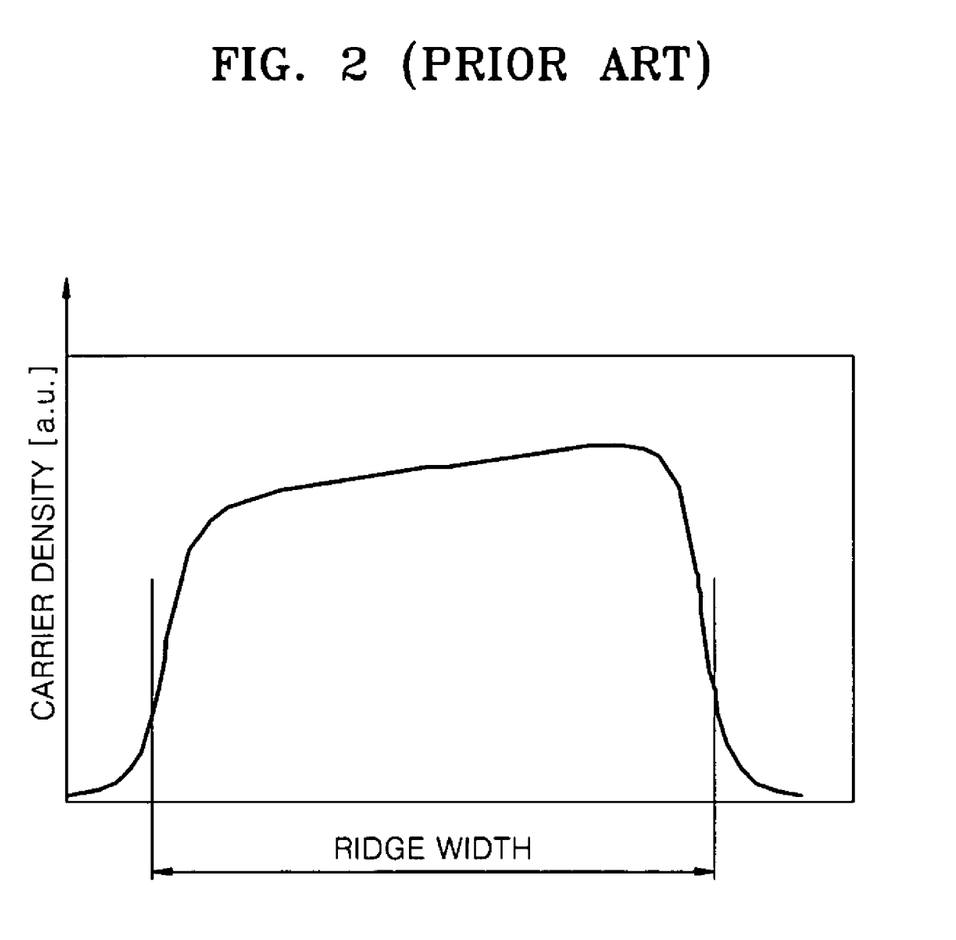
FIG. 2 is a graph illustrating a carrier density distribution for the conventional ridged semiconductor laser diode of FIG. 1.

FIG. 2 illustrates the carrier density distribution for the conventional ridged semiconductor laser diode of FIG. 1. As illustrated in FIGS. 1 and 2, there is a high density of carriers flowing along a path from a portion 15a of the p-type electrode 15 close to the n-type electrode 17. Also as is evident from FIG. 3, this current crowding leads to a non-uniform carrier density distribution.

In this way, the conventional ridged semiconductor laser diode suffers current crowding on the ridge having the same dimensions as the p-type electrode 15. That is, carrier density is high in a portion of the ridge close to the n-type electrode 17. The current crowding effect becomes more severe as ridge width increases.

Figure 3:
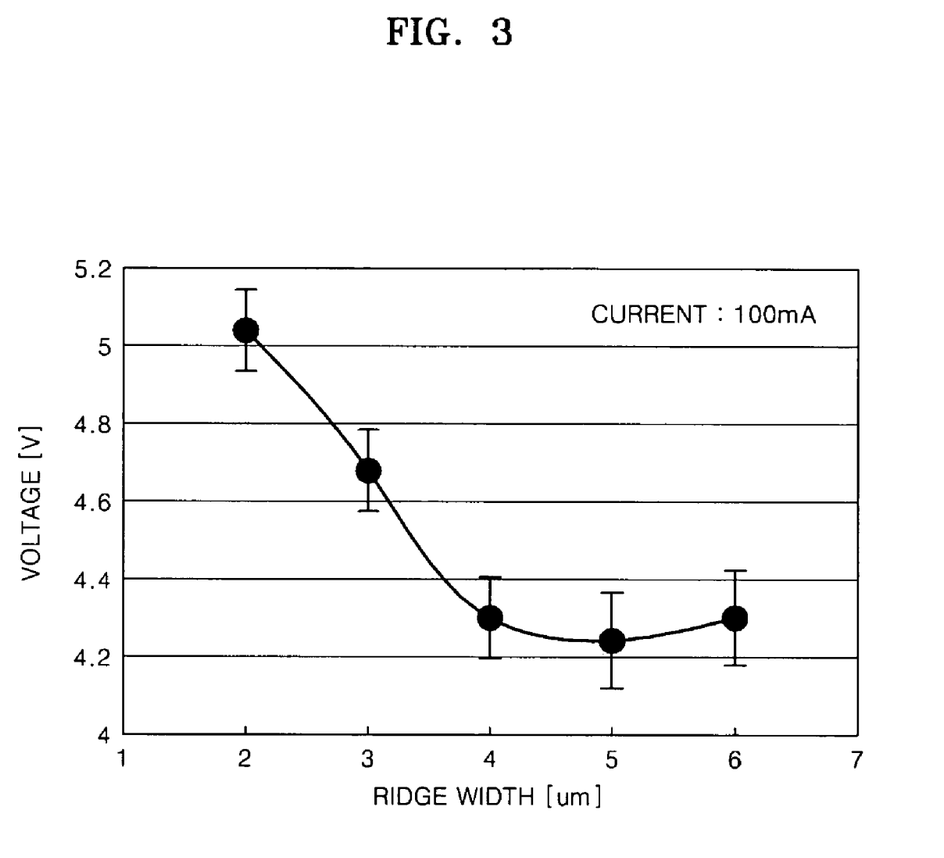
FIG. 3 is a graph illustrating a change in voltage with respect to a ridge width for the conventional ridged semiconductor laser diode of FIG. 1.

FIG. 3 illustrates a change in voltage with respect to a ridge width for the conventional ridged semiconductor laser diode of FIG. 1 when current of 100 mA is applied. As evident from FIG. 3, voltage is not substantially further reduced when the ridge width exceeds a predetermined value, e.g. 4 μm, which is called voltage saturation.

As described above, in the conventional ridged semiconductor laser diode in which the dimensions of the p-type electrode 15 are equal to that of the ridge, a maximum output power cannot be further increased and a saturated voltage drop occurs when a ridge width exceeds a predetermined value due to current crowding. Non-uniform carrier distribution due to current crowding also may cause reliability problems such as degradation due to local heating.

SUMMARY OF THE DISCLOSURE

The present invention may provide a semiconductor laser diode having a ridge that can suppress current crowding by making the carrier density distribution more uniform. According to an aspect of the present invention, there may be provided a semiconductor laser diode including a substrate, and a first semiconductor layer, an active layer, a second semiconductor layer and an electrode sequentially formed on the substrate, wherein the second semiconductor layer has a ridge and the electrode is formed on the ridge of the second semiconductor layer at a width which is less than the width of the ridge.

The center of the width of the electrode and the center of the width of the ridge do not coincide with each other. The electrode may be formed asymmetrically on one side of the ridge away from a path along which carriers move. The ridge may have a width greater than approximately 3 μm. The width of the electrode may be in the range of between approximately 50 to 80 percent of the width of the ridge. A distance between an edge of one side of the ridge and an edge of one side of the electrode close to the edge of the side of the ridge may extend in a direction of the ridge width, and is in the range of between 0 to approximately 10 percent of the ridge width.

The first and second semiconductor layers may be n- and p-semiconductor layers, respectively, and the electrode may be a p-type electrode. The first and second semiconductor layers may include n- and p-type cladding layers, respectively, and the p-type cladding layer may have a ridge structure.

The first and second semiconductor layers may further include n- and p-type light guide layers, respectively. The first semiconductor layer, the active layer, and the second semiconductor layer may be formed of GaN-based materials.

BRIEF DESCRIPTION OF THE DRAWINGS

The above and other features and advantages of the present invention will be described in detailed exemplary embodiments thereof with reference to the attached drawings in which.

DETAILED DESCRIPTION OF EXEMPLARY EMBODIMENTS

An exemplary semiconductor laser diode having a ridge according to an embodiment of the present invention will now be described more fully with reference to the accompanying drawings.

Figure 4:
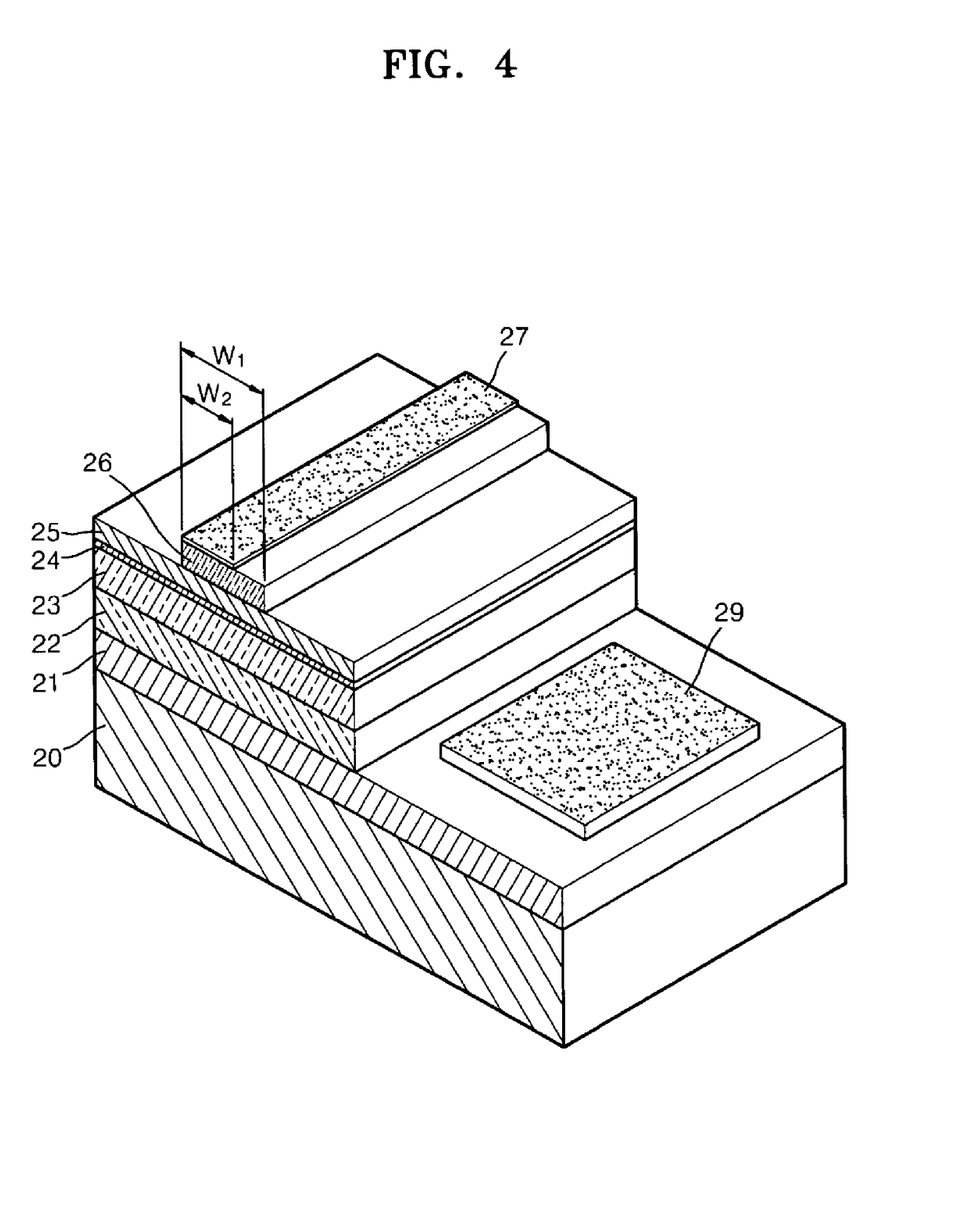
FIG. 4 illustrates a semiconductor laser diode having a ridge according to an embodiment of the present invention.

Referring to FIG. 4, a semiconductor laser diode having a ridge according to an embodiment of the present invention includes a substrate 20, a semiconductor layer 21 of a predetermined conductivity type, e.g., an n-type semiconductor layer, and a first semiconductor layer, an active layer 24, a second semiconductor layer having a ridge and a first electrode having a width less than the width of the ridge sequentially formed on a portion of the n-type semiconductor layer 21.

The first and second semiconductor layers have n- and p-types, respectively. The first semiconductor layer includes an n-type cladding layer 22. Also, the first semiconductor layer may further include an n-type light guide layer 23 disposed between the n-type cladding layer 22 and the active layer 24. The second semiconductor layer includes a p-type cladding layer 26 having a ridge. Also, the second semiconductor layer may further include a p-type light guide layer 25 disposed between the active layer 24 and the p-type cladding layer 26.

The semiconductor laser diode according to the present embodiment further includes an n-type electrode 29 formed on a portion of the n-type semiconductor layer 21. The semiconductor laser diode may be basically formed of GaN-based materials. For example, the first semiconductor layer, the active layer 24, and the second semiconductor layer may be formed of GaN-based materials.

The n-type semiconductor layer 21 and the n-type cladding layer 22 may be formed of AlxGaN (x≧0), respectively. The n-type light guide layer 23 may be formed of InxGaN (x≧0) and the active layer 24 may have a multi-quantum well (MQW) structure containing InxGaN (x≧0). The p-type light guide layer 25 may be formed of InxGaN (x≧0) and the p-type cladding layer 26 may be formed of GaN, InGaN, AlxGaN (x≧0), or InAlxGaN (x≧0).

The semiconductor laser diode having the n- and p-type light guide layers 23 and 25 is a ridge-waveguide semiconductor laser diode. In the semiconductor laser diode according to the present embodiment, a p-type electrode 27 is formed at a width x which is less than a ridge width W on the ridge of the second semiconductor layer (i.e., the ridge of the p-cladding layer 26).

In this case, the p-type electrode 27 may be formed on one side of the ridge so that the central point of the width $W_2$ of the p-type electrode 27 does not coincide with the central point of the ridge width W. In particular, as illustrated in FIG. 4, the p-type electrode 27 may be formed on the side of the ridge, away from the path along which carriers move, within the semiconductor laser diode.

Figure 5:
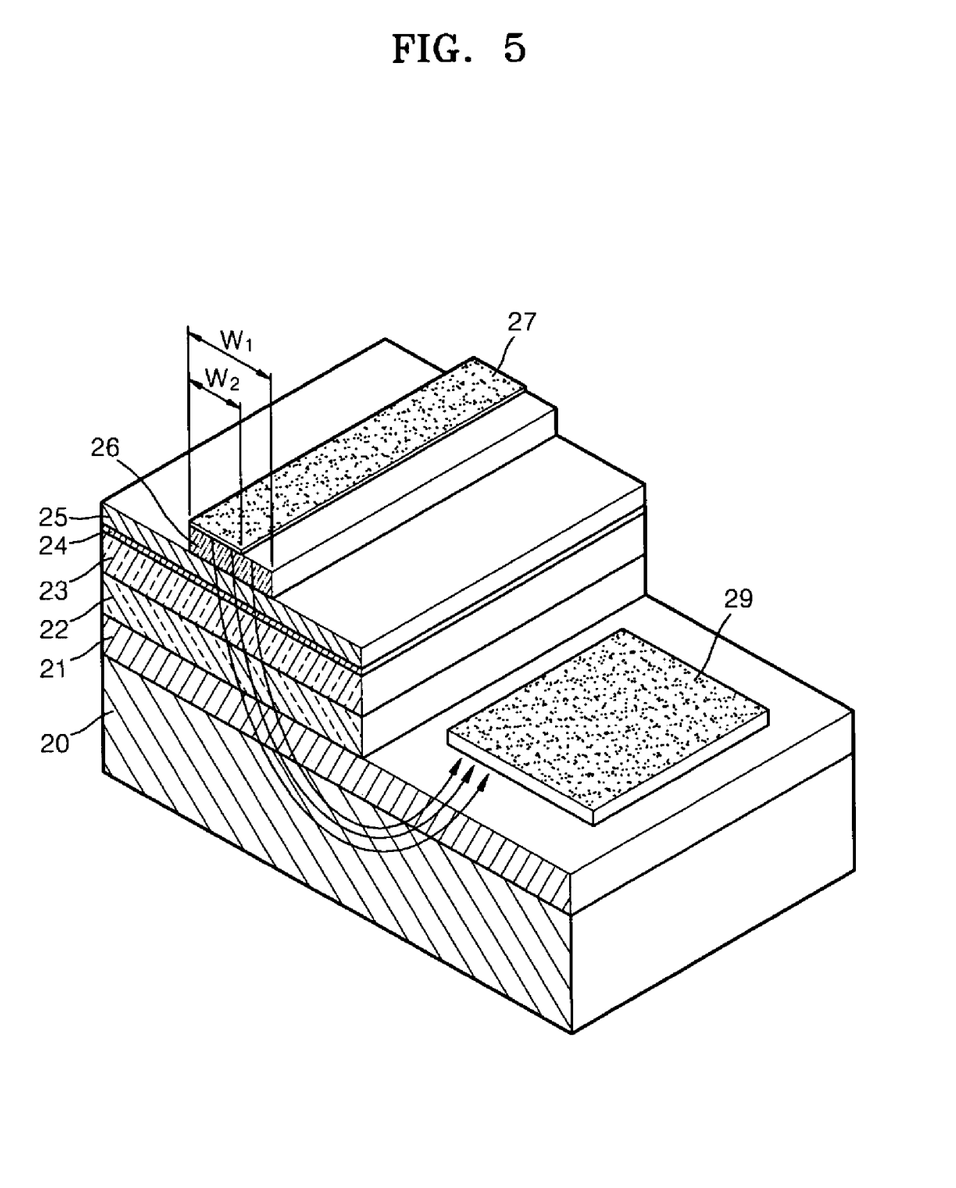
FIG. 5 illustrates a path along which carriers move from a p-type electrode to an n-type electrode in a semiconductor laser diode having a ridge according to an embodiment of the present invention.

The path along which carriers move extends from the p-type electrode 27 to the n-type electrode 29, as illustrated in FIG. 5. Because the n-type electrode 29 is formed on the portion of the n-type semiconductor layer 21 where the first semiconductor layer is not formed, the path along which carriers move is bent toward the n-type electrode 29. Thus, the side of the ridge, away from the path along which carriers move, is also far away from the n-type electrode 29.

Figure 6:
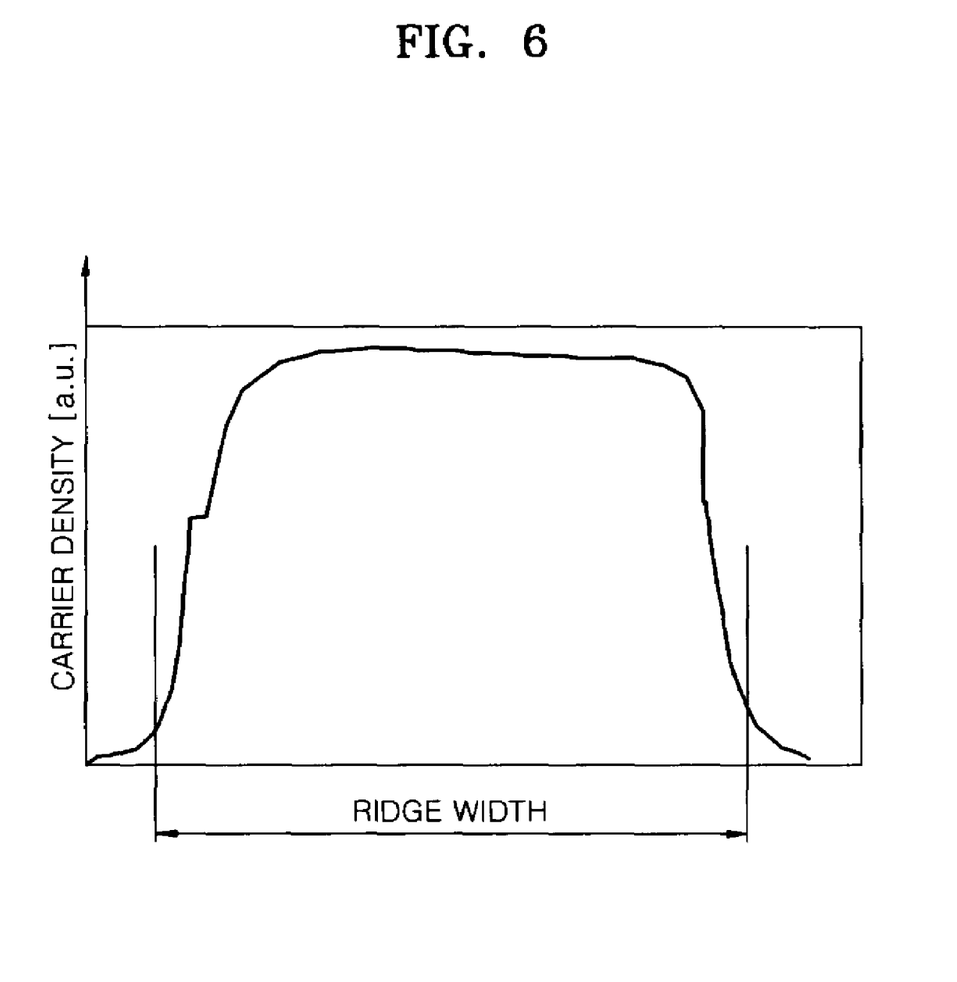
FIG. 6 is a graph illustrating a carrier density distribution for a semiconductor laser diode having a ridge according to an embodiment of the present invention.

FIG. 5 illustrates a path along which carriers move from the p-type electrode 27 to the n-type electrode 29 in the semiconductor laser diode of FIG. 4. FIG. 6 is a graph illustrating a carrier density distribution for a semiconductor laser diode having a ridge according to an embodiment of the present invention.

As evident from the comparison between FIGS. 2 and 3 and FIGS. 5 and 6, because the p-type electrode 27 has a width less than the ridge width $W_1$ as shown in FIG. 4, current crowding is suppressed, and thus a more uniform carrier density distribution is achieved than for a conventional semiconductor diode. Furthermore, the forming of p-type electrode 27 on the side of the ridge away from the path along which carriers move allows carriers to move more uniformly, thus alleviating current crowding.

As evident from FIG. 6, the semiconductor laser diode according to the present invention achieves a more uniform carrier density distribution than does the conventional laser diode as illustrated in FIG. 3.

The semiconductor laser diode having the p-type electrode 27 formed asymmetrically on one side of the ridge, having a width $W_2$ which is less than the ridge width cc, according to the present embodiment, can easily improve the uniformity of carrier distribution by simply changing the geometrical structure of the p-type electrode 27, thus alleviating a current crowding effect by virtue of a uniform carrier distribution. This increases optical output power by increasing the ridge width $W_1$, thus achieving a semiconductor laser diode having increased maximum output power.

The semiconductor laser diode according to the present invention is particularly advantageous for use in applications requiring a broad ridge for high output power.

In order to achieve high output power, the semiconductor laser diode may have a ridge wider than approximately 3 μm, preferably, having a ridge width $W_1$ of approximately 10 μm.

The width $W_2$ of the p-type electrode 27 is greater than the ridge width $W_1$, preferably, in the range of between approximately 50 to approximately 80 percent of the ridge width $W_1$ (i.e., approximately 0.5 W≦x≦approximately 0.8 W).

Figure 7:
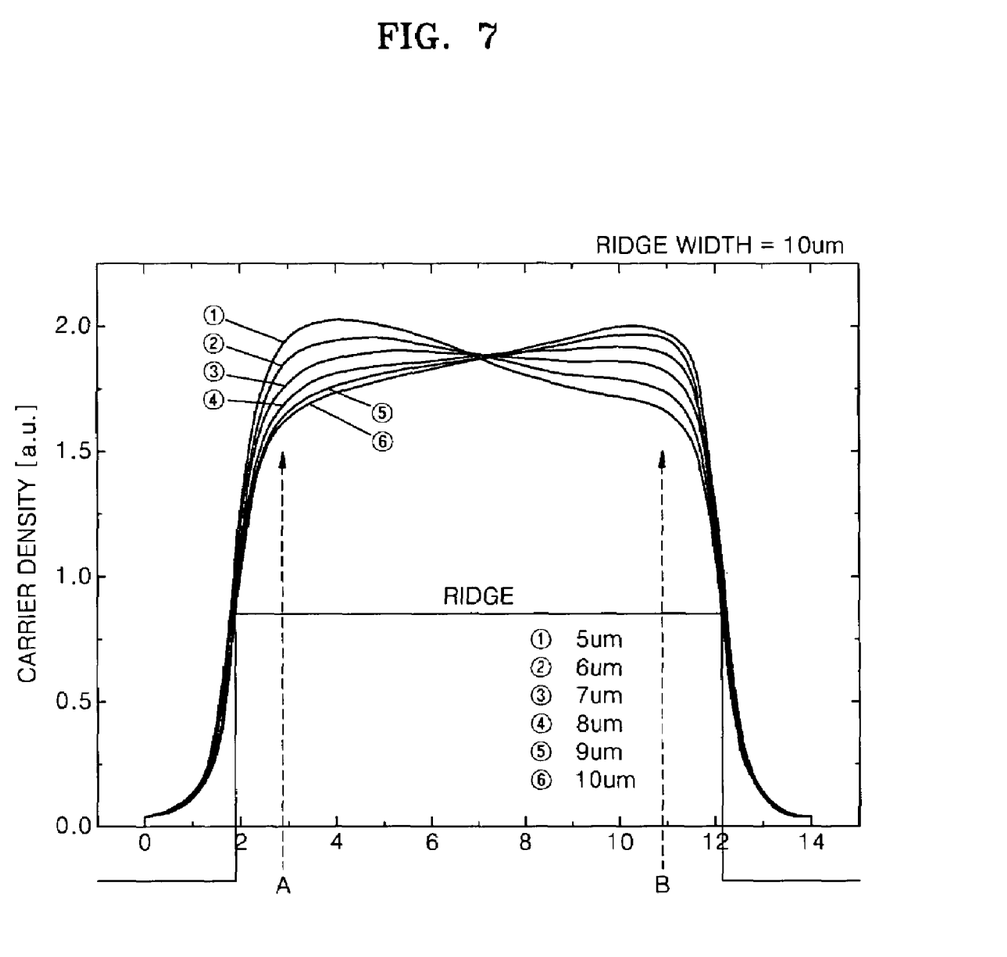
FIG. 7 is a graph illustrating carrier density distributions for the semiconductor laser diode of FIG. 4 with a ridge width W of 10 μm when the width of a p-type electrode is 5, 6, 7, 8, 9, and 10 μm, respectively.
Figure 8:
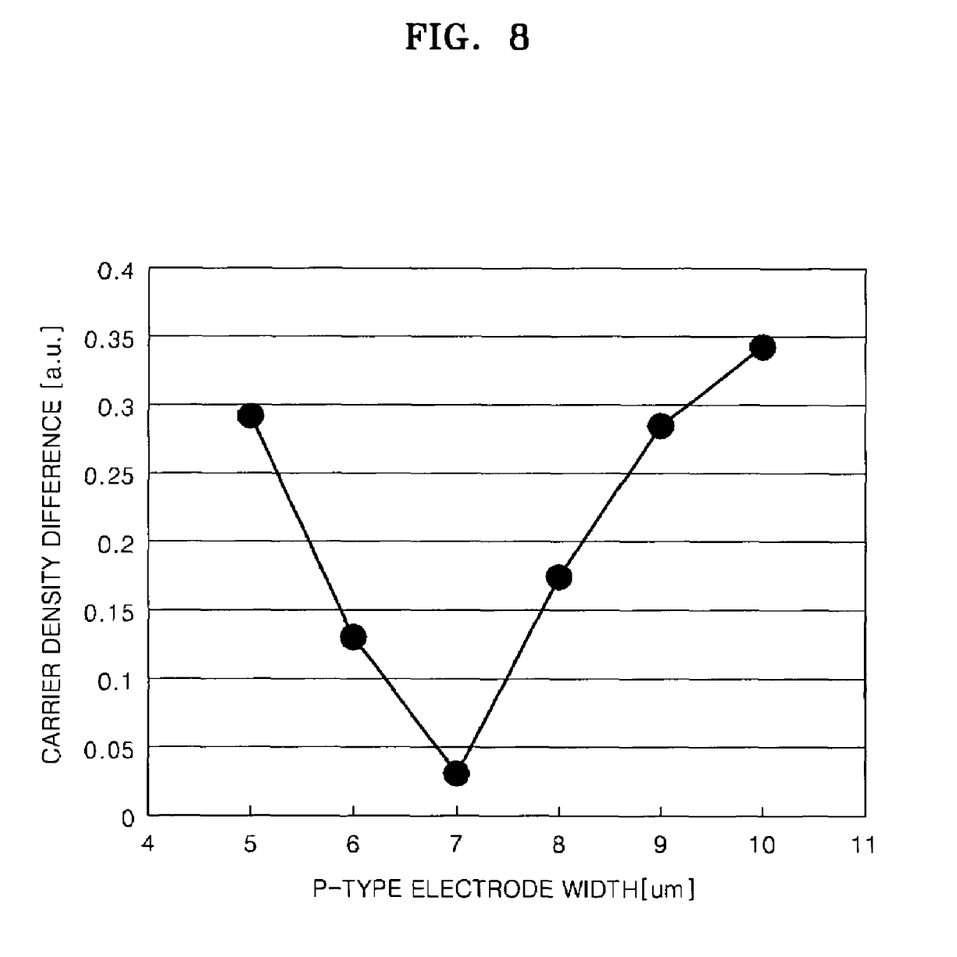
FIG. 8 is a graph illustrating a carrier density difference Δn between points A and B illustrated in FIG. 7 for each width of the p-type electrode.

FIG. 7 is a graph illustrating carrier density distributions for the semiconductor laser diode with a ridge width of 10 μm when the width $W_2$ of the p-type electrode 27 is 5, 6, 7, 8, 9, and 10 μm, respectively. FIG. 8 is a graph illustrating a carrier density difference Δn between points A and B illustrated in FIG. 7 for each width of the p-type electrode 27.

Referring to FIGS. 7 and 8, the semiconductor laser diode achieves the most uniform carrier density distribution when the p-type electrode 27 has a width of 7 μm. As evident from FIG. 8, when the width of the p-type electrode 27 is greater than half the ridge width (5 μm) and less than the total ridge width (10 μm), carrier density distribution becomes more uniform than when the ridge width $W_1$ is equal to the width of the p-type electrode 27.

FIGS. 7 and 8 illustrate a carrier density distribution with respect to a change in the width of the p-type electrode 27 when the ridge width $W_1$ is 10 μm. The ridge width $W_1$ may be greater than or less than 10 μm. As evident from FIGS. 7 and 8, the semiconductor laser diode according to the present invention can achieve a more uniform carrier density distribution when the width $W_2$ of the p-type electrode 27 is in the range of between approximately 50 to 80 percent of the ridge width $W_1$ (i.e., approximately $0.5 W_1 \leq x \leq$ approximately $0.8 W_1$) than when the width $W_2$ of the p-type electrode 27 is equal to the ridge width W.

When the width of the p-type electrode 27 is less than the ridge width $W_1$, as in the semiconductor laser diode of the present invention, voltage or resistance of the semiconductor layer diode will rise.

Figure 9:
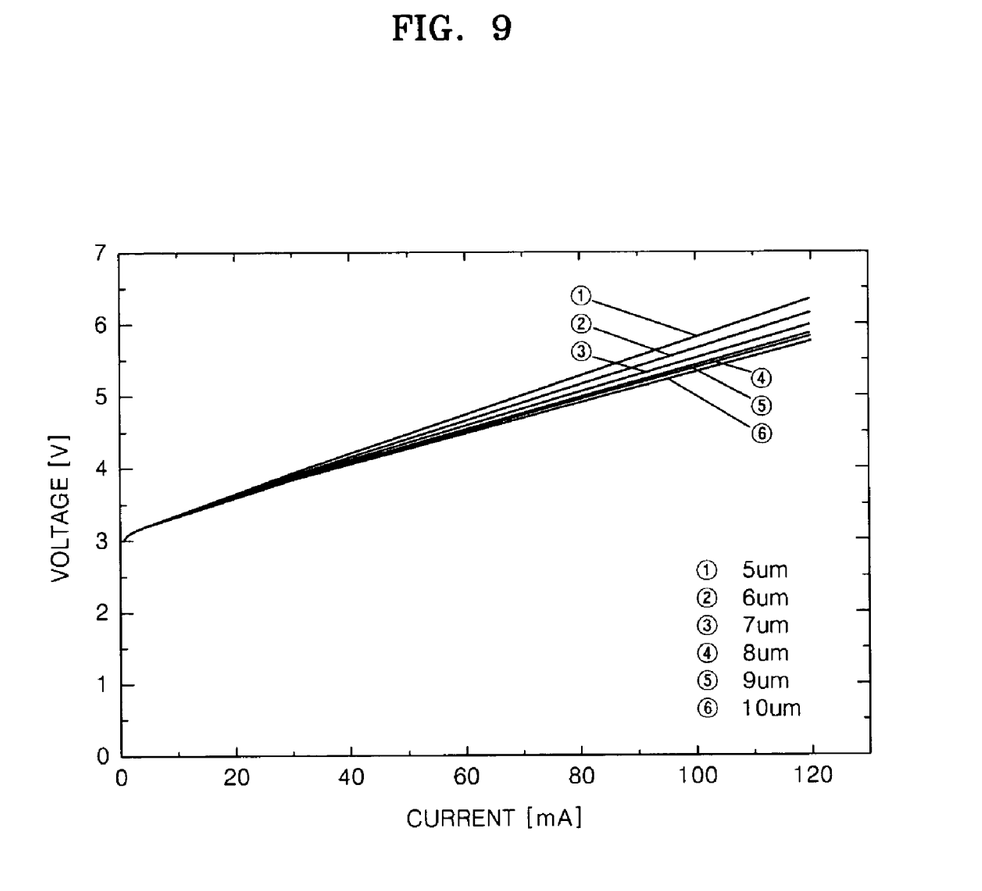
FIG. 9 is a graph of voltage against applied current for the semiconductor laser diode of FIG. 4 having a ridge width $W_1$ of 10 μm when the width of the p-type electrode is 5, 6, 7, 8, 9, and 10 μm, respectively.
Figure 10:
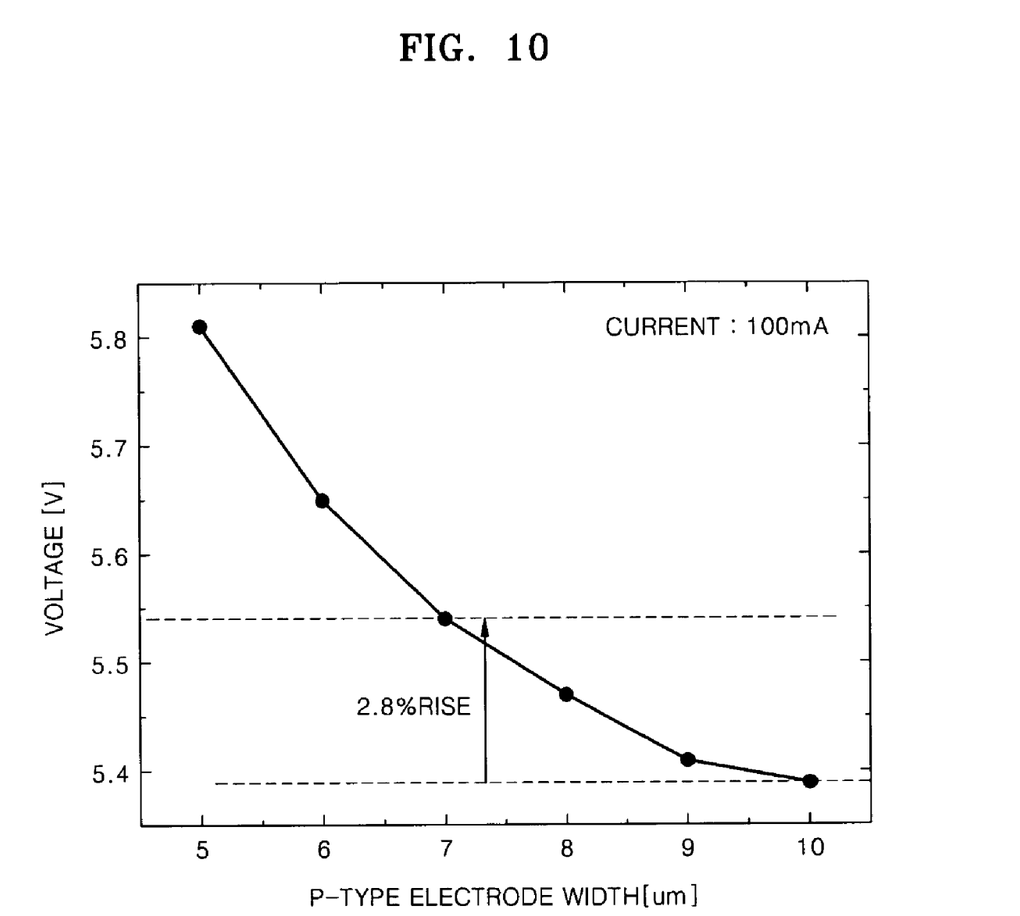
FIG. 10 is a graph illustrating a voltage with respect to each width of the p-type electrode (5, 6, 7, 8, 9, and 10 μm) in the semiconductor laser diode of FIG. 4 having a ridge width $W_1$ of 10 μm when current of 100 mA is applied.

FIG. 9 is a graph of voltage against applied current for the semiconductor laser diode of FIG. 4 having a ridge width $W_1$ of 10 μm when the width of the p-type electrode 27 is 5, 6, 7, 8, 9, and 10 μm, respectively. FIG. 10 is a graph illustrating a voltage with respect to each width of the p-type electrode 27 (5, 6, 7, 8, 9, and 10 μm) in the semiconductor laser diode of FIG. 4 having a ridge width $W_1$ of 10 μm when current of 100 mA is applied.

Referring to FIGS. 9 and 10, when current of 100 mA is applied, the voltage rises by 2.8% from 5.39 V (at the p-type electrode width of 10 μm equal to the ridge width $W_1$) to 5.54 V (at the p-type electrode width of 7 μm). That is, the voltage is increased slightly as the width $W_2$ of the p-type electrode 27 decreases to less than the ridge width $W_1$.

In the semiconductor laser diode of the present invention, operating current remains almost at the same level in spite of a change in the width $W_2$ of the p-type electrode 27 because only the width $W_2$ of the p-type electrode 27 varies when the ridge width $W_1$ is fixed at 10 μm. That is, input current applied to achieve the same optical output power remains nearly the same. Typically, input power increases by the amount of voltage increase. Thus, input power increases slightly because voltage is increased by a small amount as the width $W_2$ of the p-type electrode 27 is reduced to less than the ridge width $W_1$.

In this manner, the semiconductor laser diode of the present invention can suppress a current crowding effect without increasing input power by a large amount, thus providing a uniform carrier density distribution. This increases ridge width compared to a conventional semiconductor laser diode, thus achieving a high output power semiconductor laser diode.

In the semiconductor laser diode of FIG. 4, the p-type electrode 27 has a width less than the ridge width $W_1$ so that an edge of one side of the ridge is aligned with an edge of a corresponding side of the p-type electrode 27.

Figure 11:
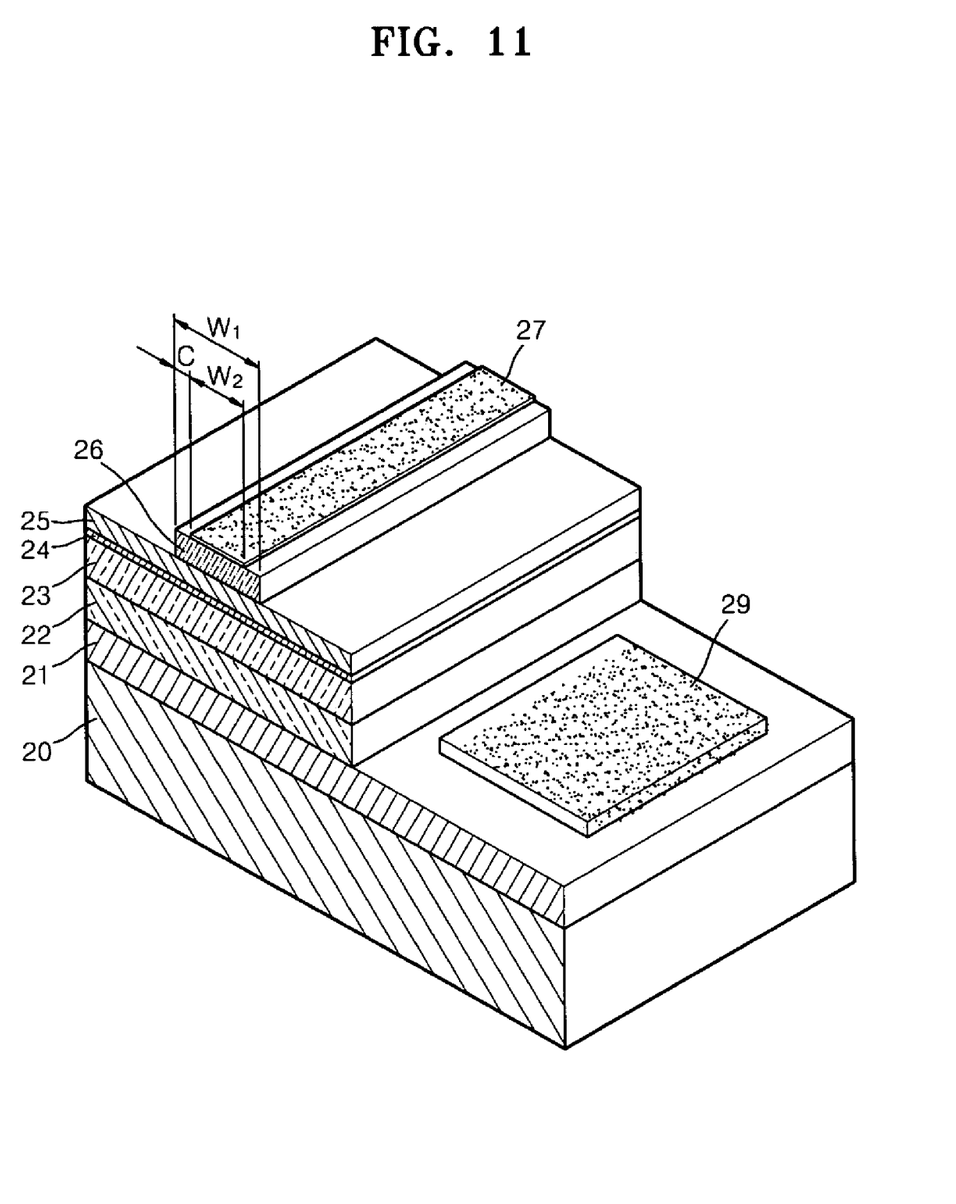
FIG. 11 illustrates a semiconductor laser diode having a ridge according to another embodiment of the present invention.

However, the edge of the side of the p-type electrode 27 may not be aligned with the edge of the side of the ridge. FIG. 11 illustrates a semiconductor laser diode having a ridge according to another embodiment of the present invention. Referring to FIG. 11, an edge of one side of the p-type electrode 27 may be positioned apart from an edge of one side of the ridge close to the edge of the side of the p-type electrode 27 by a distance 'c' in a direction of the ridge width. In this instance, the distance 'c' between the two side edges may range between 0 to approximately 10 percent of the ridge width $W_1$.

A semiconductor laser diode includes an electrode having a width which is less than the width of the ridge on which the electrode is formed, thus providing a more uniform carrier density distribution. By increasing the width of the ridge, high output power is achieved, thus increasing a maximum optical power. The semiconductor laser diode can also alleviate a current crowding effect by virtue of a uniform carrier density distribution, thus providing improved reliability by preventing local heating.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor laser diode including:
   a substrate,
   a first semiconductor layer, an active layer, and a second semiconductor layer sequentially formed on the substrate,
   a first electrode formed on an exposed top surface of the first semiconductor layer, and
   a second electrode formed on a top surface of the second semiconductor layer to form a ridge waveguide semiconductor laser diode,
   wherein the second semiconductor layer has a ridge and the second electrode is formed on a top surface of the ridge of the second semiconductor layer, the second electrode having a width, which is less than a width of the ridge, and
   wherein the center of the width of the second electrode and the center of the width of the ridge do not coincide with each other.

2. The semiconductor laser diode of claim 1, wherein the electrode is formed asymmetrically on one side of the ridge away from a path along which carriers move.

3. The semiconductor laser diode of claim 2, wherein the ridge has a width greater than approximately 3 μm.

4. The semiconductor laser diode of claim 2, wherein the width of the electrode is in the range of between approximately 50 to 80 percent of the width of the ridge.

5. The semiconductor laser diode of claim 4, wherein a distance between an edge of one side of the ridge and an edge of one side of the electrode close to the edge of the side of the ridge extends in a direction of the ridge width, and is in the range of between 0 to approximately 10 percent of the ridge width.

6. The semiconductor laser diode of claim 1, wherein the ridge has a width greater than approximately 3 μm.

7. The semiconductor laser diode of claim 1, wherein the width of the electrode is in the range of between approximately 50 to 80 percent of the ridge width.

8. The semiconductor laser diode of claim 7, wherein a distance between an edge of one side of the ridge and an edge of one side of the electrode close to the edge of the side of the ridge extends in a direction of the ridge width and is in the range of between 0 to approximately 10 percent of the ridge width.

9. The semiconductor laser diode of claim 1, wherein the first and second semiconductor layers are n- and p-type semiconductor layers, respectively, and the electrode is a p-type electrode.

10. The semiconductor laser diode of claim 9, wherein the first and second semiconductor layers include n- and p-type cladding layers, respectively, and the p-type cladding layer has a ridge structure.

11. The semiconductor laser diode of claim 9, wherein the first and second semiconductor layers further include n- and p-type light guide layers, respectively.

12. The semiconductor laser diode of claim 9, wherein the first semiconductor layer, the active layer, and the second semiconductor layer are formed of GaN-based materials.

* * * * *